(12) United States Patent
Chen

(10) Patent No.: US 12,099,076 B2
(45) Date of Patent: Sep. 24, 2024

(54) SAMPLE FIXATION MECHANISM FOR TEST WITH NANO-PROBE, APPARATUS FOR TEST AND SAMPLE TEST METHOD

(71) Applicant: CHANGXIN MEMORY TECHNOLOGIES, INC., Hefei (CN)

(72) Inventor: Jiabao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/651,583

(22) Filed: Feb. 18, 2022

(65) Prior Publication Data

US 2022/0381804 A1 Dec. 1, 2022

Related U.S. Application Data

(63) Continuation of application No. PCT/CN2021/099208, filed on Jun. 9, 2021.

(30) Foreign Application Priority Data

May 26, 2021 (CN) .......................... 202110580231.4

(51) Int. Cl.
*G01R 1/04* (2006.01)
*H01J 37/20* (2006.01)
(Continued)

(52) U.S. Cl.
CPC ............ *G01R 1/0408* (2013.01); *H01J 37/20* (2013.01); *H01L 21/6835* (2013.01); *G01N 23/2204* (2013.01); *H01J 2237/2008* (2013.01)

(58) Field of Classification Search
CPC ................... G01R 1/0408; H01J 37/20; H01J 2237/2008; H01J 37/28; H01J 2237/2007; H01L 21/6835; G01N 23/2204
See application file for complete search history.

(56) References Cited

U.S. PATENT DOCUMENTS 3,040,401 A 6/1962 Von
5,699,925 A 12/1997 Petruzzi
(Continued)

FOREIGN PATENT DOCUMENTS

CN 201230046 Y * 4/2009
CN 102680876 A 9/2012
(Continued)

OTHER PUBLICATIONS

Huang et al., English translation of CN-103605064-A (Year: 2014).*
(Continued)

*Primary Examiner* — Giovanni Astacio-Oquendo
*Assistant Examiner* — Haidong Zhang
(74) *Attorney, Agent, or Firm* — Syncoda LLC; Feng Ma

(57) ABSTRACT

The present disclosure discloses a sample fixation mechanism for a test with a nano-probe, an apparatus for a test with a nano-probe, and a sample test method. The sample fixation mechanism includes a base having a first assembly surface; a holder having a second assembly surface matched with the first assembly surface, wherein the holder further has a fixation surface opposite to the second assembly surface, and the fixation surface is configured to be adhered and fixed with the sample; a lock structure having a locked state and an unlocked state, wherein in the locked state, the lock structure is capable of fixing the holder relative to the base, and in the unlocked state, the holder may be removed from the base.

14 Claims, 2 Drawing Sheets

(51) Int. Cl.
     *H01L 21/683*     (2006.01)
     *G01N 23/2204*    (2018.01)

(56) References Cited

U.S. PATENT DOCUMENTS

2010/0218287 A1*   8/2010   Nakata .................. G01Q 70/12
                                                                850/30
2011/0297329 A1    12/2011   Canale et al.

FOREIGN PATENT DOCUMENTS

| CN | 103605064 | A | * | 2/2014 |
| CN | 105719989 | A | | 6/2016 |
| CN | 106526443 | A | | 3/2017 |
| CN | 106947958 | A | | 7/2017 |
| CN | 206503813 | U | | 9/2017 |
| CN | 109738673 | A | * | 5/2019 |
| CN | 110133019 | A | | 8/2019 |
| GB | 751819 | A | | 7/1956 |
| JP | 2006306458 | A | * | 11/2006 |

OTHER PUBLICATIONS

Xu, English translation of CN-201230046-Y (Year: 2009).*
Li, English translation of CN-109738673-A. (Year: 2019).*
19. Odajima et al., English translation of JP-2006306458-A. (Year: 2005).*
International Search Report and Written Opinion as cited in PCT/CN2021/099208 mailed Mar. 1, 2022, 11 pages.

* cited by examiner

SAMPLE FIXATION MECHANISM FOR TEST WITH NANO-PROBE, APPARATUS FOR TEST AND SAMPLE TEST METHOD

CROSS-REFERENCE TO RELATED APPLICATIONS

This application is a continuation application of International Patent Application No. PCT/CN2021/099208, filed on Jun. 9, 2021, which claims the priority to Chinese Patent Application No. 202110580231.4, filed on May 26, 2021. International Patent Application No. PCT/CN2021/099208 and Chinese Patent Application No. 202110580231.4 are incorporated herein by reference in their entireties.

TECHNICAL FIELD

The present disclosure relates to the field of semiconductor manufacturing technologies, and in particular, to a sample fixation mechanism for a test with a nano-probe, an apparatus for a test with a nano-probe, and a sample test method.

BACKGROUND

With regard to failure analysis of defects of microstructures and soft failures of devices, such as abnormal output characteristics of MOSs and abnormal output characteristics of FETs, it is necessary to adopt higher-resolution electrical test means, such as nano-probes, to perform accurate electrical tests and defect localization. A nano-probe machine is a nano-probe system integrated with a scanning electron microscope (SEM). During tests for samples with the nano-probes, the stability of adhering the samples on sample holders directly affects the accuracy of test data and the duration the tests take.

During the tests for the samples with the nano-probes, the samples are required to be adhered on the sample holders, such that the nano-probes may be stably pierced on sample test positions to test near-perfect electrical data. In general, in the prior art, the samples are adhered on the sample holders with a copper tape or carbon tape, and fed into a scanning electron microscope (SEM) machine. Since the samples are not firmly adhered, the samples are frequently shifted when being observed with the SEM, which results in incapability of inserting the nano-probes for the test the samples. As a result, the samples are required to be re-mounted and re-adhered, and a nano-probe inserting procedure is run. As such, the tests could be very time-consuming.

SUMMARY

According to a first aspect of the present disclosure, a fixation mechanism for a nano-probe test is provided. The fixation mechanism includes a base having a first assembly surface; a holder having a second assembly surface matched with the first assembly surface, wherein the holder further has a fixation surface opposite to the second assembly surface, and the fixation surface is configured to be adhered and fixed with the sample; a lock structure having a locked state and an unlocked state, wherein in the locked state, the lock structure is capable of fixing the holder relative to the base, and in the unlocked state, the holder may be removed from the base.

According to a second aspect of the present disclosure, an apparatus for a test with a nano-probe is provided. The apparatus includes the sample fixation mechanism.

According to a third aspect of the present disclosure, a sample test method based on a nano-probe test is provided. The sample test method includes the following steps: adhering a sample to a fixation surface of a holder with an adhesive; matching a second assembly surface of the holder with a first assembly surface of the base, and fixing the holder relative to the base by means of a lock structure; testing the sample by using the nano-probe to acquire test data of the sample.

REFERENCE NUMERALS

11—base; 12—holder; 13—lock structure; 14—sample; 15—locator block; 16—first groove; 17—second groove; 18—notch; 19—third groove; 20—elastic member; 201—fixation body; 202—elastomer; and 203—extrusion body.

DESCRIPTION OF EMBODIMENTS

In order to make the objectives, the technical solutions, and the advantages of the present disclosure clearer, the present disclosure will be further described in detail in conjunction with specific implementations and with reference to accompanying drawings. It should be understood that these descriptions are only exemplary and are not intended to limit the scope of the present disclosure. In addition, in the following description, descriptions of well-known structures and technologies will be omitted to avoid unnecessarily obscuring the concept of the present disclosure.

Figure 1:
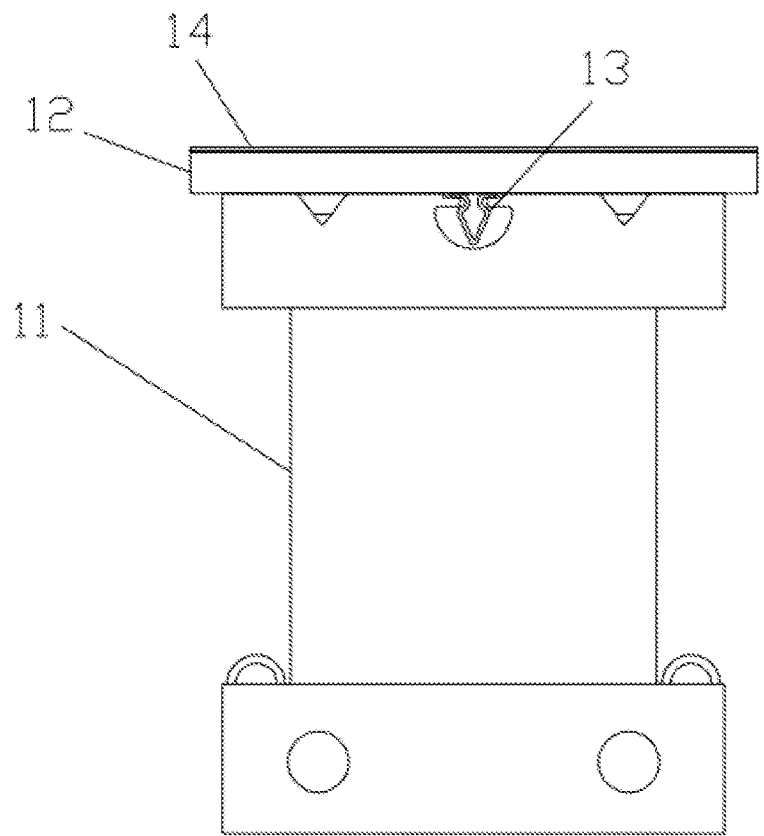
FIG. 1 is a schematic structural diagram of a fixation mechanism for a test with a nano-probe according to an embodiment of the present disclosure.
Figure 2:
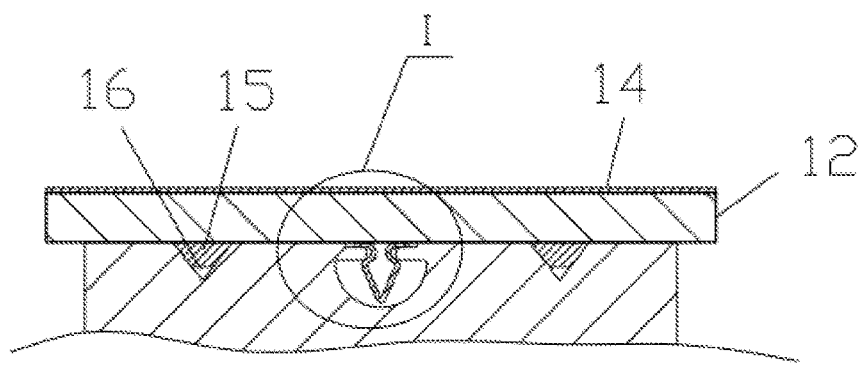
FIG. 2 is a schematic structural diagram of a fixation mechanism for a test with a nano-probe according to another embodiment of the present disclosure.
Figure 3:
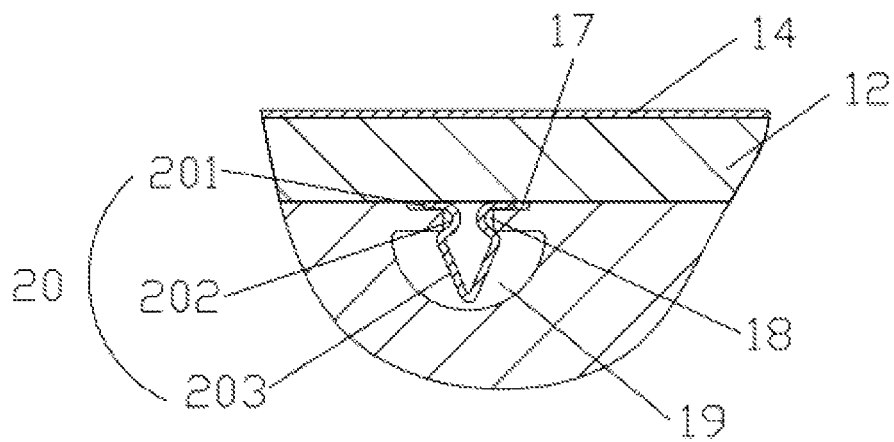
FIG. 3 is an enlarged view of a part I shown in FIG. 2.

According to a specific embodiment of the present disclosure, a first aspect provides a fixation mechanism for a test with a nano-probe. With reference to FIG. 1 to FIG. 3, the fixation mechanism includes a base 11, a holder 12 and a lock structure 13. The base 11 has a first assembly surface. The holder 12 has a second assembly surface matched with the first assembly surface. The holder 12 further has a fixation surface opposite to the second assembly surface. The fixation surface is configured to be adhered and fixed with a sample 14. The lock structure 13 has a locked state and an unlocked state, wherein in the locked state, the lock structure 13 is capable of fixing the holder 12 relative to the base 11, and in the unlocked state, the holder 12 may be removed from the base 11. The fixation surface and the sample 14 may be adhered and fixed by an adhesive. When tested by using the nano-probe, the sample 14 is adhered and fixed on the holder 12 with a silver adhesive, a hot melt adhesive and an AB adhesive (including resin and a curing agent as components). The silver adhesive needs to be baked at a high temperature after being adhered with the sample 14. The hot-melt adhesive is required to be heated from a solid state to a liquid state before being firmly adhered. The sample 14 may be firmly adhered to the holder 12 only if the above-mentioned adhesives are heated at a high temperature, which may prevent the sample 14 from shifting during the test with the nano-probe. However, the existing base 11 may not be directly heated on a heating table. If a bonded part on the base 11 may be damaged to fall off and a solder may be melted due to heating, and a plastic material which may not be heated exists on the base 11, the holder 12 may be removed from the base 11 by means of a removable connection of the holder 12 and the base 11, and then separately heated on the heating table. Accordingly, the sample 14 and the base 11 are not required to be heated together, such that cases where the bonded part on the base 11 may be damaged to fall off and the solder may be melted due to heating, and the plastic material is heated to deform due to heating, and the like are avoided. The sample 14 is firmly adhered to the holder 12 after the adhesive is melted in a high-temperature heating fashion. Moreover, the second assembly surface of the holder 12 is matched with the first assembly surface of the base 11, and the holder 12 is fixed relative to the base 11 by means of the lock structure 13. Further, the sample 14 is fed into a nano-probe machine, and tested by using the nano-probe to acquire the test data of the sample 14. In this way, the sample 14 will not be shifted when being observed with a scanning electron microscope (SEM), and the nano-probe may be accurately inserted for testing the sample 14. The sample 14 is not required to be re-mounted and repeatedly adhered, and a nano-probe inserting procedure is run. As a result, the operation time is reduced, the operation efficiency is increased, and the accuracy and the timeliness of the test data may be enhanced simultaneously.

In some embodiments, a prominent locator block 15 is disposed on the second assembly surface, a first groove 16 is provided in the first assembly surface, and the locator block 15 is matched with the first groove 16. By matching the locator block 15 with the first groove 16, a relative position of the holder 12 and the base 11 may be made more accurate and will not be shifted during a movement process of the base 11, and further the sample 14 may not be shifted when being observed with the SEM.

In some embodiments, the lock structure 13 may be configured as a buckle structure. The buckle structure may include a first connection portion and a second connection portion, wherein one of the first connection portion and the second connection portion may be disposed on the base 11 and the other one may be disposed on the holder 12. Particularly, the first connection portion may be configured as an insertion member, and the second connection portion may be provided with an insertion hole. After the insertion member is inserted into the insertion hole, the insertion member is locked and fixed by means of a lock component, such that the holder 12 and the base 11 may be in a locked state. The lock component is pressed to eject the insertion member out of the insertion hole, such that the holder 12 and the base 11 may be in an unlocked state.

In some embodiments, the lock structure 13 includes a first connection portion and a second connection portion, wherein the first connection portion is disposed on the base 11, and the second connection portion is configured as an elastic member 20; one end of the elastic member 20 is connected with the second assembly surface and the other end of the elastic member 20 is clamped into the first connection portion, such that the holder 12 and the base 11 are in a locked state; and the other end of the elastic member 20 is extruded to deform and eject the first connection portion, such that the holder 12 and the base 11 are in an unlocked state.

In an exemplary embodiment, the first connection portion includes a second groove 17, a notch 18 and a third groove 19 that are sequentially communicated from top to bottom, wherein the width of the notch 18 in a horizontal direction is less than that of the second groove 17 and that of the third groove 19, and a protrusion is formed between the second groove 17 and the third groove 19. The second connection portion includes a fixation body 201, an elastomer 202 and an extrusion body 203 that are sequentially connected from top to bottom. The extrusion body 203 is of a hollow inverted triangle. The elastomer 202 is connected with two sides of the extrusion body 203, the elastomer 202 is arranged symmetrically, the elastomer 202 has a concave surface, and the protrusion is matched with the concave surface. The fixation body 201 is connected with the second assembly surface, the fixation body 201 is located within the second groove 17, the elastomer 202 is matched with the notch 18, and the extrusion body 203 is located within the third groove 19. When the second connection portion is inserted into the first connection portion from top to bottom, the extrusion body 203 is aligned with the notch 18, the holder 2 is pressed downwards, and the extrusion body 203 is extruded by the protrusion on two sides, such that the extrusion body 203 drives the elastomer 202 to inwards contract and deform in a horizontal direction until the extrusion body 203 is embedded within the third groove 19, and the elastomer 202 has an elastic stress for contraction and deformation to ensure that the concave surface clamps the protrusion, such that the holder 12 and the base 11 are in a locked state. When the holder 12 and the base 11 are required to be unlocked, two sides of the extrusion body 203 are pressed inwards with your fingers, such that the extrusion body 203 drives the elastomer 202 to contract and deform inwards in the horizontal direction. In this case, a concave surface of the elastomer 202 loosens the protrusion, the extrusion body 203 is ejected upwards to separate from the third groove 19, such that the holder 12 and the base 11 are in an unlocked state, and the holder 12 may be removed from the base 11.

In some embodiments, the locator block 15 includes at least two opposite inclined surfaces, and a spacing between two inclined surfaces gradually decreases in a direction away from the holder 12 from the second assembly surface. The locator block 15 protrudes from the second assembly surface, that is, the locator block 15 protrudes from the bottom surface of the holder 12. A spacing between two inclined surfaces gradually decreases from top to bottom. Since the locator block 15 is matched with the first groove 16, a matching inclined surface is further correspondingly disposed within the first groove 16. In this way, the holder 12 may be favorably mounted on the base 11 or removed from the base 11 by means of the guide of the inclined surfaces, or the holder 12 may be more accurately mounted on the base 11. Moreover, during a movement process of the base 11, the relative position of the holder 12 and the base 11 will not be shifted, and the sample 14 may not be shifted when being observed with the SEM. The locator block 15 may be arranged at intervals along the circumference of the holder 12. As such, multiple directions of the holder 12 may be restricted, and the stability of the sample 14 during a test process may be ensured.

In an exemplary embodiment, the holder 12 includes a gasket, and the gasket has a second assembly surface and a fixation surface. The gasket may be made of a material that is resistant to high temperature and easily adhered and fixed with a silver adhesive, a hot melt adhesive, an AB adhesive, and the like, for example, may be made of a metal material, which will be not excessively limited here.

In some embodiments, the sample 14 is a wafer or chip.

According to a specific embodiment of the present disclosure, a second aspect provides an apparatus for a test with a nano-probe. The apparatus includes a sample 14 fixation mechanism. A sample 14 is adhered to a fixation surface of a holder 12 with an adhesive. The holder 12 is heated on a heating table. The sample 14 is firmly adhered to the holder 12 after the adhesive is melted. Moreover, a second assembly surface of the holder 12 is matched with a first assembly surface of a base 11, and the holder 12 is fixed relative to the base 11 by means of a lock structure 13. Further, the base 11 is fixed on a nano-probe machine, and the sample 14 is tested by using the nano-probe when being observed with a scanning electron microscope (SEM) to acquire test data of the sample 14.

Figure 4:
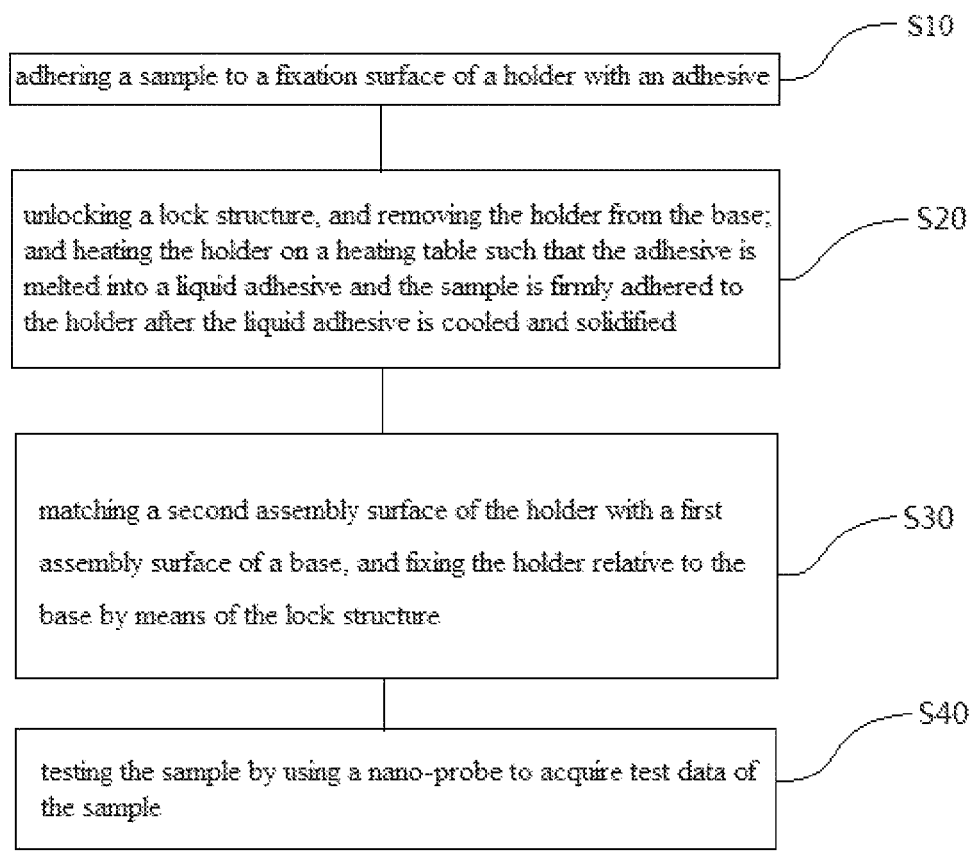
FIG. 4 is a flowchart of a sample test method based on a test with a nano-probe according to another embodiment of the present disclosure.

According to a specific embodiment of the present disclosure, a third aspect provides a sample test method based on a test with a nano-probe. With reference to FIG. 4, the method includes the following steps:

step S10, adhering a sample to a fixation surface of a holder with an adhesive, wherein the adhesive is one of a hot melt adhesive, an AB adhesive or a silver adhesive.

step S20, unlocking the lock structure, and removing the holder from the base; heating the holder on a heating table such that the adhesive is melted into a liquid adhesive and the sample is firmly adhered to the holder after the liquid adhesive is solidified. The holder may be heated to 165° C. to 175° C., optionally, heated and baked at 170° C. for about 20 minutes. Among them, after the holder 12 is adhered with the silver adhesive, the silver adhesive is required to be baked at a high temperature. As a result, the adhesive is melted into a liquid adhesive. The sample 14 may be firmly adhered to the holder 12 after the liquid adhesive is cooled and solidified. The holder 12 is conveniently removed from the base 11 by means of a removable connection of the holder 12 and the base 11. Accordingly, the sample 14 and the base 11 are not required to be heated together, such that cases where the bonded part on the base 11 may be damaged to fall off and the solder may be melted due to heating, and the plastic material is heated to deform, and the like are avoided. After the adhesive is melted in a high-temperature heating fashion, the sample 14 is firmly adhered to the holder 12 after the liquid adhesive is cooled and solidified. Moreover, the second assembly surface of the holder 12 is matched with the first assembly surface of the base 11, and the holder 12 is fixed relative to the base 11 by means of the lock structure 13. Further, the sample 14 is fed into a nano-probe machine, and tested by using the nano-probe to acquire the test data of the sample 14. In this way, the sample 14 will not be shifted when being observed with a scanning electron microscope (SEM), and the nano-probe may be accurately inserted for testing the sample 14. The sample 14 is not required to be re-mounted and repeatedly adhered, and a nano-probe inserting procedure is run. As a result, the operation time is reduced, the operation efficiency is increased, and the accuracy and the timeliness of the test data may be enhanced simultaneously.

step S30, matching a second assembly surface of the holder to a first assembly surface of the base, and fixing the holder relative to the base by means of a lock structure.

step S40, testing the sample by using the nano-probe to acquire test data of the sample, wherein the base 11 of the sample 14 fixation mechanism subjected to the above step S30 is fixed on a nano-probe machine, and the sample 14 is tested by using the nano-probe when being observed with a scanning electron microscope (SEM) to acquire the test data of the sample 14.

Subsequent to the step S40, a sample 14 test method based on a test with a nano-probe may further include the following steps: unlocking the lock structure 13, removing the holder 12 from the base 11, and grinding the sample 14 to obtain the next test address; matching the second assembly surface of the holder 12 with the first assembly surface of the base 11 again, and fixing the holder 12 relative to the base 11 by means of the lock structure 13; and performing the next test on the sample 14 by using the nano-probe to acquire the next test data of the sample 14. The holder 12 is conveniently removed from the base 11 by means of a removable connection of the holder 12 and the base 11. In this way, the sample 14 may be directly ground to obtain the next test address. Accordingly, no needs for removing the sample and then grinding the removed sample to obtain the next test address are made, such that the operation time is reduced and the operation efficiency is increased.

It should be understood that the above detailed description of the present disclosure merely serves to exemplify or explain the principle of the present disclosure, and not intended to limit the present disclosure. Accordingly, any modifications, equivalent substitutions, improvements and the like made without departing from the spirit and scope of the present disclosure should be included in the protection scope of the present disclosure. Also, the appended claims of the present disclosure are intended to cover all changes and modifications that fall within the scope and boundary of the appended claims, or equivalent forms of such scope and boundary.

What is claimed is:

1. A fixation mechanism for a test with a nano-probe, comprising:
   a base, having a first assembly surface;
   a holder, having a second assembly surface matched with the first assembly surface, wherein the holder further has a fixation surface opposite to the second assembly surface, and the fixation surface is configured to be adhered and fixed with a sample; and
   a lock structure, having a locked state and an unlocked state, wherein
   in the locked state, the lock structure is capable of fixing the holder relative to the base, and
   in the unlocked state, the holder can be removed from the base.

2. The fixation mechanism according to claim 1, wherein a prominent locator block is disposed on the second assembly surface, a first groove is provided in the first assembly surface, and the prominent locator block is matched with the first groove.

3. The fixation mechanism according to claim 1, wherein the lock structure comprises a first connection portion and a second connection portion, wherein the first connection portion is disposed on the base, the second connection portion is configured as an elastic member, one end of the elastic member is connected with the second assembly surface, and the other end of the elastic member is clamped into the first connection portion, so that the holder and the base are in the locked state; and
   the other end of the elastic member is extruded to deform and eject the first connection portion, such that the holder and the base are in the unlocked state.

4. The fixation mechanism according to claim 3, wherein the first connection portion comprises a second groove, a notch and a third groove that are sequentially communicated from top to bottom, wherein a width of the notch in a horizontal direction is less than that of the second groove and that of the third groove, and a protrusion is formed between the second groove and the third groove;

the second connection portion comprises a fixation body, an elastomer and an extrusion body that are sequentially connected from top to bottom, wherein the extrusion body is of a hollow inverted triangle, the elastomer is connected with two sides of the extrusion body, the elastomer is arranged symmetrically, the elastomer has a concave surface, and the protrusion is matched with the concave surface;

the fixation body is connected with the second assembly surface, the fixation body is located within the second groove, the elastomer is matched with the notch, and the extrusion body is located within the third groove; and when the second connection portion is inserted into the first connection portion from top to bottom, the extrusion body is aligned with the notch, the holder is pressed downwards, and the extrusion body is extruded by the protrusion on two sides, such that the extrusion body drives the elastomer to inwards contract and deform in a horizontal direction until the extrusion body is embedded within the third groove, and the elastomer has an elastic stress for contraction and deformation to ensure that the concave surface clamps the protrusion.

5. The fixation mechanism according to claim 2, wherein the prominent locator block comprises at least two opposite inclined surfaces, and a spacing between two inclined surfaces gradually decreases in a direction away from the holder from the second assembly surface.

6. The fixation mechanism according to claim 1, wherein the holder comprises a gasket, and the gasket has the second assembly surface and the fixation surface.

7. The fixation mechanism according to claim 1, wherein the sample is a wafer or chip.

8. An apparatus for a test with a nano-probe, comprising a sample fixation mechanism, the sample fixation mechanism comprising:
   a base, having a first assembly surface;
   a holder, having a second assembly surface matched with the first assembly surface, wherein the holder further has a fixation surface opposite to the second assembly surface, and the fixation surface is configured to be adhered and fixed with a sample; and
   a lock structure, having a locked state and an unlocked state, wherein
   in the locked state, the lock structure is capable of fixing the holder relative to the base, and
   in the unlocked state, the holder can be removed from the base.

9. The apparatus for a test with a nano-probe, comprising the sample fixation mechanism according to claim 8, wherein a prominent locator block is disposed on the second assembly surface, a first groove is provided in the first assembly surface, and the prominent locator block is matched with the first groove.

10. The apparatus for a test with a nano-probe, comprising the sample fixation mechanism according to claim 8, wherein the lock structure comprises a first connection portion and a second connection portion, wherein the first connection portion is disposed on the base, the second connection portion is configured as an elastic member, one end of the elastic member is connected with the second assembly surface, and the other end of the elastic member is clamped into the first connection portion, so that the holder and the base are in the locked state; and
   the other end of the elastic member is extruded to deform and eject the first connection portion, such that the holder and the base are in the unlocked state.

11. The apparatus for a test with a nano-probe, comprising the sample fixation mechanism according to claim 10, wherein the first connection portion comprises a second groove, a notch and a third groove that are sequentially communicated from top to bottom, wherein a width of the notch in a horizontal direction is less than that of the second groove and that of the third groove, and a protrusion is formed between the second groove and the third groove;

the second connection portion comprises a fixation body, an elastomer and an extrusion body that are sequentially connected from top to bottom, wherein the extrusion body is of a hollow inverted triangle, the elastomer is connected with two sides of the extrusion body, the elastomer is arranged symmetrically, the elastomer has a concave surface, and the protrusion is matched with the concave surface;

the fixation body is connected with the second assembly surface, the fixation body is located within the second groove, the elastomer is matched with the notch, and the extrusion body is located within the third groove; and when the second connection portion is inserted into the first connection portion from top to bottom, the extrusion body is aligned with the notch, the holder is pressed downwards, and the extrusion body is extruded by the protrusion on two sides, such that the extrusion body drives the elastomer to inwards contract and deform in a horizontal direction until the extrusion body is embedded within the third groove, and the elastomer has an elastic stress for contraction and deformation to ensure that the concave surface clamps the protrusion.

12. The apparatus for a test with a nano-probe, comprising the sample fixation mechanism according to claim 9, wherein the prominent locator block comprises at least two opposite inclined surfaces, and a spacing between two inclined surfaces gradually decreases in a direction away from the holder from the second assembly surface.

13. The apparatus for a test with a nano-probe, comprising the sample fixation mechanism according to claim 8, wherein the holder comprises a gasket, and the gasket has the second assembly surface and the fixation surface.

14. The apparatus for a test with a nano-probe, comprising the sample fixation mechanism according to claim 8, wherein the sample is a wafer or chip.

\* \* \* \* \*